United States Patent [19] | [11] 3,825,353
Loro | [45] July 23, 1974

[54] MOUNTING LEADS AND METHOD OF FABRICATION

[75] Inventor: Alberto Loro, Ottawa, Ontario, Canada

[73] Assignee: Microsystems International Limited, Montreal, Quebec, Canada

[22] Filed: July 12, 1972

[21] Appl. No.: 271,150

[30] Foreign Application Priority Data

June 6, 1972 Canada........................ 144,012

[52] U.S. Cl. ........................ 317/234 R, 317/234 N
[51] Int. Cl. ........................ H01l 5/00
[58] Field of Search ........................ 317/234

[56] References Cited

UNITED STATES PATENTS

| | | | |
|---|---|---|---|
| 3,620,932 | 11/1971 | Crishal | 204/15 |
| 3,623,961 | 11/1971 | Blok van Laer | 204/15 |
| 3,639,811 | 2/1972 | Schroeder | 317/234 |
| 3,653,999 | 4/1972 | Fuller | 156/11 |
| 3,654,526 | 4/1972 | Cunningham et al. | 317/234 |

*Primary Examiner*—Rudolph V. Rolinec
*Assistant Examiner*—E. Wojciechowicz
*Attorney, Agent, or Firm*—E. E. Pascal

[57] ABSTRACT

A beam terminal for a semiconductor chip which does not cantilever outwardly from the chip, and which extends no further than the boundary thereof. The beam terminal is adherent to the chip at one position, allowing the remainder thereof to flex with applied stress. The beam terminalled chip thus may be handled using economical mass production techniques.

10 Claims, 15 Drawing Figures

MOUNTING LEADS AND METHOD OF FABRICATION

This invention relates to the field of semiconductor mounting contacts, and more specifically to a new type of contact for use with semiconductor devices.

It has become evident that the high labour content involved in wire bonding electrical contacts of semiconductor devices to substrates has necessitated a search for a low-cost mass production technique for semiconductor chip orientation and bonding. Three leading contenders have emerged: so-called spider bonding, flip-chip metallic "bumps", and beam leads.

For various reasons not at issue here, spider bonding is not widely used at present. The remaining two types of structures are used from time to time, but many factors not directly involved in the function of bonding have limited their general acceptance. Some of these problems concern chip separation from the wafer, the replaceability of defective chips on a substrate, etc.

Among the advantages of the so-called "flip-chip" technique, which utilizes chips having terminal solder bumps on their top surfaces which are positioned upside down facing a mirror image arrangement of terminal pads on a substrate, are the following: chip handling and testing methods are similar to those used with chips which are to be wire bonded; hence are well known, conventional, and relatively simple. There are essentially no topological constraints on circuit layout, since the terminal bumps may be located anywhere on the chip, and not necessarily close to the edge thereof. Thermal dissipation is distributed as widely as the heat-conducting bumps are located, and is not restricted to the edges of the chip as with beam leads. There is no excess chip area used over chips which are to be wire bonded. Wafers carrying the chips may be scribed and broken or sawn in a similar manner as those to be wire bonded, and there is little critical wafer thickness constraint.

However, there are certain disadvantages which have restricted the widespread use of terminal bumps. There is an extremely high rigidity of the chips to the mounting substrate, which allows little stress release after bonding, resulting commonly in chip failure. In addition, very tight control of bump and substrate planarity is required in order that all bumps should make proper contact. Because of the above disadvantages, the preferable gold to gold thermocompression bonding technique has been found to be unfeasible, except involving very small area chips.

It has also been found that defective chips are more difficult to replace than wire bonded or beam leaded chips.

Beam leads are desirable since the beams, in being cantilevered outwardly from the chip, are flexible and their gold terminal pads are malleable. Therefore there is a significant element of release of stress which has been caused by dimensional mismatch between the chip and substrate. Because of the stress release, efficient thermocompression bonding can be used. All connections directly to the silicon chip are preformed and can be pretested. Defective chip removal and replacement is possible.

The disadvantages of the beam lead structure involve the requirement for increased silicon area to accommodate the outwardly cantilevered beam areas, which requires a wide separation channel between chips on a wafer. This decreases the numbers of devices which can be formed on a wafer. Separation of the chips is based on costly procedures which use chemical etching and require precise control of slice thickness, as well as back surface photolithographic alignment. The separation process is sufficiently complex that device probing before separation is generally not regarded as being reasonably reliable. Therefore, special techniques for probing after separation are required.

Separated chips cannot be handled by conventional methods or equipment such as shaker feeds, which makes cost reducing automatic chip placement production lines unfeasible.

In addition, the insulation at the places where the beams cross the chip edges is mechanically prone to damage, and hence it has been found to be a potential source of short circuits between layers, or of current leakage. Because the cantilevered beams are located at the chip edges, thermal dissipation is available only from the edges of the chip. In addition, since the beams extend from the edges of the chip, conductor runs cannot go around them between the beams and the chip edge, placing a constraint on certain topological circuit layouts.

The present invention combines all of the advantages of both beam leads and flip-chip bump terminals noted above while avoiding the disadvantages. Because of the stress-release facility, high reliability thermocompression bonds of, for instance, gold, to a gold conductor pattern on a substrate may be used. During bonding, there is little strain on the connection between the terminal and the semiconductor active device itself.

Projecting beams are eliminated in the present invention, removing the requirement for a wide chip separation channel, thus maximizing the numbers of devices fabricated on a wafer.

Convention separation techniques, such as scribe and break or diamond sawing can be used, which allows use of presently available wire bonded chip separation and handling machinery. Ordinary mass production handling techniques can be used to locate the chip on a substrate, and a single and simple application of bonding pressure to thermocompression bond all terminals at once is facilitated.

The mounting terminals may be located anywhere dictated by the circuit topology on the chip, as with solder bumps, and need not be located at the edges thereof. Accordingly, topological constraints on layouts are eliminated. As well, since the bonding pads may be located anywhere on the surface, heat sinking to the substrate may be achieved wherever desired.

The bonding technique is particularly applicable to very large chips, since mechanical support thereof may be distributed over their areas.

As a sealed junction technique using silicon nitride and noble metals described by M. P. Lepselter in the Bell Laboratories Record of October/November 1966, page 299 ff. may be used, or the beam lead fabrication technique described in U.S. Pat. application by C. A. Hamer and A. Loro, Ser. No. 229,993 filed Feb. 28, 1972, combined with the flip-chip bump terminal technology, an extremely reliable, low cost and mass bondable structure is now provided.

The novel features of the terminal involve a terminal anchor region on the surface of a semiconductor chip, a conductive beam terminal adherent to the anchor region, the beam terminal having a pliant arm portion non-adherent to the surface extending over another portion of the chip, its boundary extending no farther than the boundary of the chip, and a connection pad region on the surface of said arm a predetermined distance from the anchor region.

Accordingly, it is a feature of this invention that a beam lead is contained totally within the boundaries of the chip, and is not cantilevered outwardly from the edge thereof. Hence the beam lead can be located anywhere on the chip, allowing circuit conductor or other active regions to be located between the beam and the edge of the chip. Since there is no projection from the side of the chip, there is no need to leave wide separation channels between chips on the wafer, and conventional chip separation techniques may be used. In direct contrast to the aforementioned bump terminal, however, the beam terminal is adherent to the semiconductor device at only one position in the preferred embodiment, and is connected through a pliant arm to a connection pad region on the surface of the beam terminal located a predetermined distance from the anchor region. The pliancy of the arm between the two positions provides the required stress release.

A raised land or thickened portion of the beam terminal at the connection pad region, preferably consisting of gold, allows gold to gold thermocompression bonding to a substrate, using similar mass production handling techniques to those used with solder bumps for placement of the chip in location.

A better understanding of the invention will be obtained by reference to the figures described below, the figures being distorted in dimension for the sake of clarity, in which.

Figure 1:
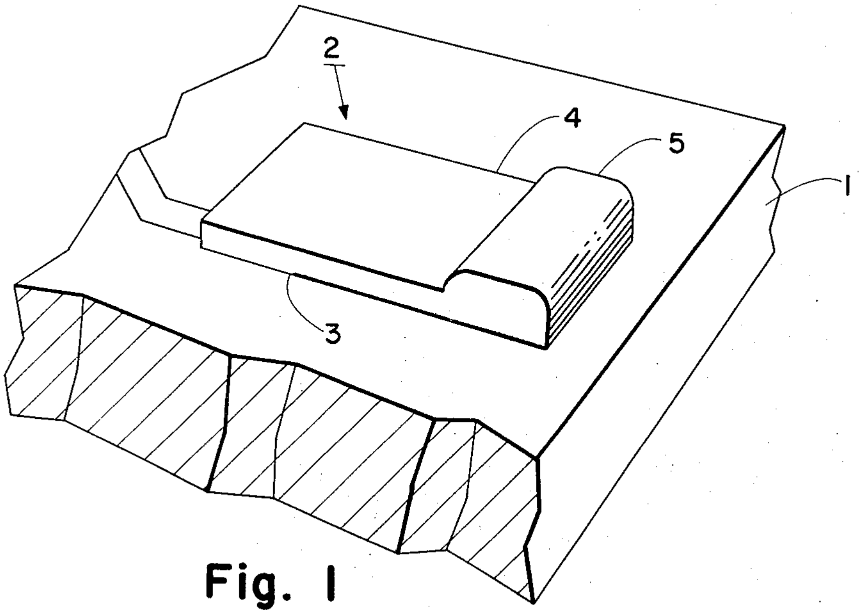
FIG. 1 is a perspective view of a single beam lead according to this invention.

Turning now to FIG. 1, a portion of a chip 1 on which a beam lead 2 is mounted is shown in perspective. By the term "beam lead" is meant a terminal to which external connection may be made, in which one portion is solidly adherent to the chip, and external connection is to be made at a point a distance from the solidly adherent portion. The beam lead thus can flex. Accordingly, tensile bending forces, which may be caused by externally applied stress, temperature differential effects, etc., result in an upward being of the beam. If the beam is bent slightly upward, e.g., due to bonding forces, it can also flex with compression forces. Beam leads known heretofore have been cantilevered outwardly from the sides of the chip. In the present invention, the beam leads extend no further than the edges.

The conductive beam lead of the present invention is comprised of a portion adherent to an anchor region 3 on the surface of the chip, and a pliant arm portion 4 which is nonadherent to said surface extending over another portion of the chip. The boundary of the beam lead extends no further than the boundary of the chip. A connection pad region on the surface of the arm a predetermined distance from the anchor region is the place of connection of the lead to an external substrate or circuit. Preferably the connection pad region is comprised of a raised land 5, which can be thermocompression bonded to a substrate. However, bump terminals on the substrate can be used to connect to a connection pad on the arm which is not raised.

Because of the non-adherence of the arm portion 4 to the chip 1, stress exerted at the point of connection at the raised land 5 will cause bending of the pliant arm, relieving the stress and resulting in a highly reliable and stress-free connecting interface.

It is further not absolutely required that the arm portion be tab-shaped, since numerous variations in configuration may usefully be used, as will be noted later.

Figure 2:
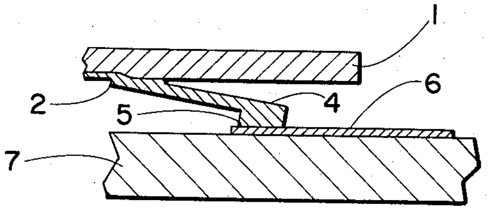
FIG. 2 is a sectional view of the beam lead connected to a substrate.

FIG. 2 shows in section a connection between a chip and substrate according to this invention. A chip 1 is placed face down on a matching terminal pad 6, laid out in mirror image to the connection pads of beam leads 2. In this preferred embodiment, raised land 5 has been thermocompression bonded to terminal pad 6, which is adherent to substrate 7. For illustration purposes, it has been assumed that stress has been applied between the chip and substrate, and bending of the pliant arm 4 to relieve the stress is clearly evident.

It may therefore be seen that maximum utility of available wafer space is similar to the benefit obtained using connection bumps on the chip. However, since the terminals are in fact beams, the deficiency of rigidity in previously known bump terminalled chips is avoided, and the benefit of pliancy or resiliency of beam leads is obtained.

Figure 3:
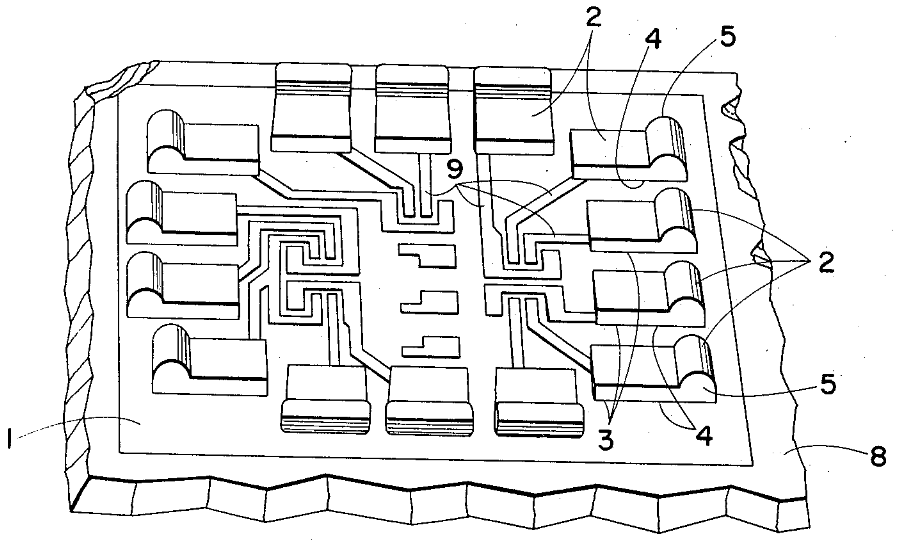
FIG. 3 is a perspective view of a semiconductor chip device having fourteen terminals constructed according to this invention.

Turning now to FIG. 3, shown in perspective is a bipolar integrated circuit chip using the beam leads of the present invention, the beam sizes being relatively undistroted in relative size to the circuit. The chip 1, having been separated from its wafer, has a portion of the separation channel 8 delineated.

Metallization paths 9 lead from active devices to the beam leads 2, each of which is comprised of an anchor region 3 adherent to the surface of the chip, a pliant arm portion 4, and a raised land 5 extending upwardly from the beam lead to which external connection is to be made. The rounded nature of the corners of the beam leads is due to the electroplating build up of the gold beam.

It will be immediately obvious that the chip may be mounted in the conventional way and wire bonded to terminal pads on a substrate, or may be turned over and mounted face down on matching terminal pads on the substrate in the manner of solder bumps on flip-chip devices, and thermocompression bonded.

A description of the process will be given by reference to the following examples of fabrication of the invention. FIGS. 4A to 4D show cross-sectional views of a portion of a wafer at various stages of manufacture thereof.

EXAMPLE 1

A polished single crystal silicon wafer 1 of about 2 inches in diameter and about 250 microns thick was passed through a conventional and well-known integrated circuit fabrication process, resulting in the production of an integrated circuit comprising various regions doped appropriately with impurities to form N and/or P regions. The entire surface was protected in a well-known manner by thermally growing a layer of silicon dioxide 10 on the surface thereof. Contact window holes were cut at appropriate points for connection to various regions of the surface of the silicon, using conventional and well-known photolithography. The wafer was then coated with silicon nitride (not shown) by the reaction of silane and ammonia in the well-known manner used in sealed junction beam lead technology, described in the article entitled Beam Lead Sealed Junction Technology by M. P. Lepselter, pages 298 ff. of the Bell Laboratories Record Vol. 34, No. 9, October/November 1966. After contact windows were reopened by photolithography, platinum silicide was formed in the windows to provide satisfactory ohmic contact to the underlying silicon (not shown) The entire top surface of the wafer was then coated with a thin adherent layer of titanium 11, followed by a thin layer of platinum 12 as is described in the aforementioned Lepselter article, after which the platinum layer was etched in aqua regia into a suitable interconnection pattern, using an appropriate photolithograph mask, leaving the titanium layer unetched.

In the circumstances where normal beam leads are to be produced, the platinum would be protected from etchant in the preceding step over both the metallic interconnect pattern and over the areas covered by the positions of the beams. In the present invention, the only beam terminal areas additional to the interconnect pattern protected from etching are only those places where the beams are to be anchored, generally shown as area 13 in FIG. 4B.

A photoresist pattern was next formed over the surface of the wafer, having identical geometry and being aligned with the platinum interconnect pattern, but having opposite contrast sense, so that all exposed titanium areas are covered with photoresist, and all platinum surfaces remain uncovered.

Electrical connection was next made to the wafer, which was made cathodic in a well-known gold electroplating bath. Approximately 2 microns of gold 14 was deposited on the exposed platinum pattern, providing a highly conductive interconnection pattern plus an adherent metal anchor for the beam. The titanium, covered with photoresist, retains no gold, and in fact will spontaneously have a layer of oxidized titanium form on its surface.

The photoresist layer covering the titanium was then removed and the entire front surface of the wafer was electrolessly plated with nickel. This was performed by immersion of the wafer in a sensitizer for 1 minute at 25°C, comprised of a solution of stannous chloride, $SnCl_2$, 10 grams per liter and concentrated hydrochloric acid, HCl, 2 milliliters per liter. The wafer was then rinsed for 1 minute in running deionized water, after which it was immersed in an activator for 30 seconds at 25°C comprised of a solution of palladium chloride, $PdCl_2 \cdot 2H_2O$, 0.1 grams per liter and concentrated hydrochloric acid, 1 milliliter per liter. The wafer was then rinsed for 30 seconds in running deionized water.

The wafer was then immersed in Sel-Rex Lectroless (trademark) nickel solution available from Oxy Metal Finishing of Canada, Rexdale, Ontario, for 1 minute at 90°C for nickel 15 plating, after which it was rinsed for 10 minutes in running deionized water.

Another photoresist mask was then applied to the surface which left exposed only the anchor areas 13 plus a region extending therefrom corresponding to the total beam area. The wafer was again placed in a gold electrodeposition bath and about 15 microns of gold 16 was deposited on the main structure of the beam lead.

Photoresist was again removed and another photoresist plating mask was applied to leave exposed only those portions of the beam leads which were to be built up to raised lands for thermocompression bonding. The wafers were then immersed in the gold electrodeposition bath and the raised gold lands 5 built up about 15 additional microns.

Figure 4A:
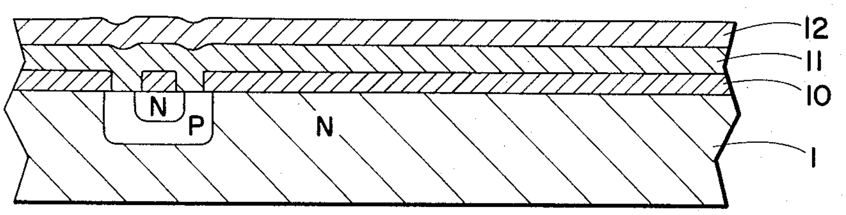
FIGS. 4A through 4D are sectional views of a semiconductor chip showing stages of fabrication of the invention.
Figure 4B:
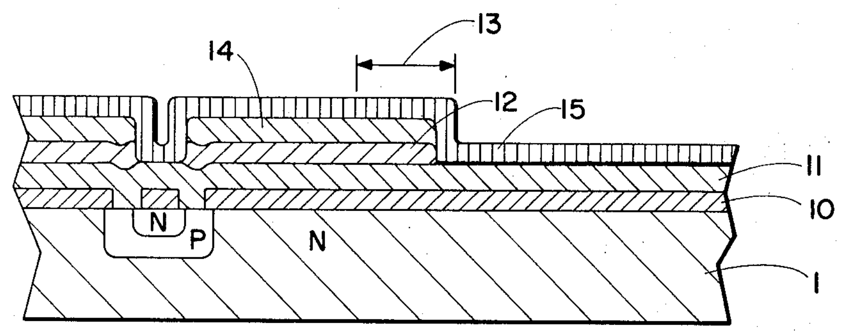
Figure 4C:
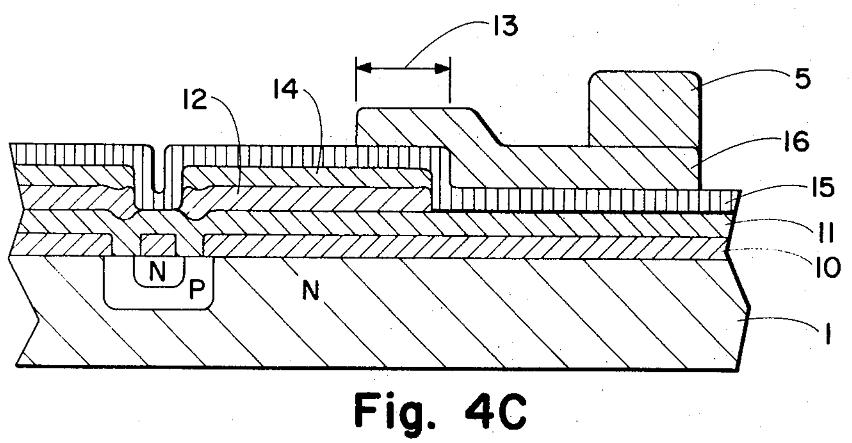
Figure 4D:
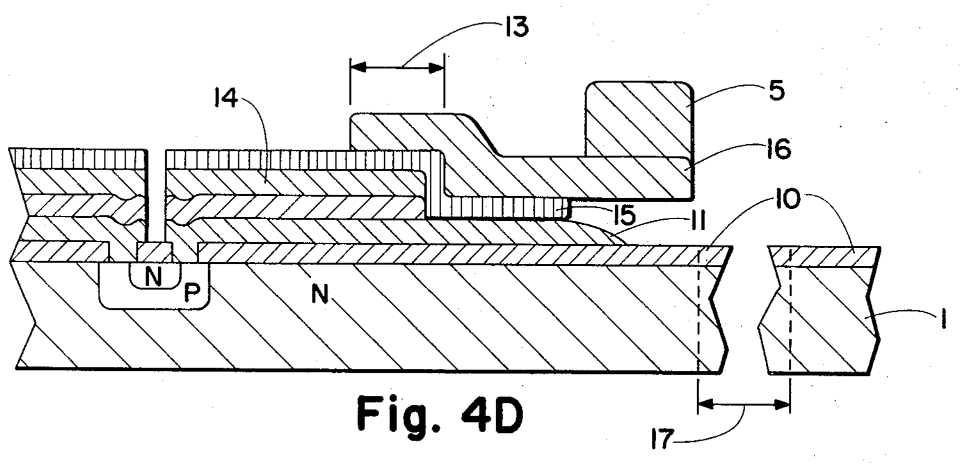

The photoresist was removed, and the wafer was exposed to an etching solution containing ethylenediamene tetracetic acid, ammonium hydroxide, and hydrogen peroxide at 50°C until all nickel and titanium had been removed from between the gold plated areas. In FIG. 4D it may be seen that the nickel and titanium layers 11 and 15 respectively have been etched at least partially from under the gold beam 16. It was found that only a portion of these layers underlying the beam were in fact etched out. However, titanium, in having a natural oxide skin, caused extremely poor adherence of the nickel thereto, and the beam to be virtually non-adherent over its entire surface except over the anchor region 13, where the nickel is adherent to the gold layer 14, and the platinum under the gold is adherent to the titanium.

Pull tests using pressure-adhesive tape caused bending of the beams upwardly except at the anchor region 13, thereby showing that adhesion was restricted to this region.

Wafers were then electrically probe tested using conventional equipment. They were then scribed and broken in the chip separation channels 17 using conventional and well-known techniques.

EXAMPLE 2

The invention beam leads were applied to an MOS Field Effect Transistor Integrated Circuit, which utilizes aluminum metallization. The test vehicle was a silicon gate MOS 256 bit Random Access Memory Circuit. Reference is made to FIGS. 5A to 5H which show the structure at various stages in the process.

A chip 1 having already diffused P or N type regions as required, and protected by a silicon dioxide layer 18 was coated with an aluminum metallization layer 19 which was to be defined into a conductor pattern. The entire circuit, and vacuum deposited aluminum layer, was fabricated in a normal and well-known manner.

Figure 5A:
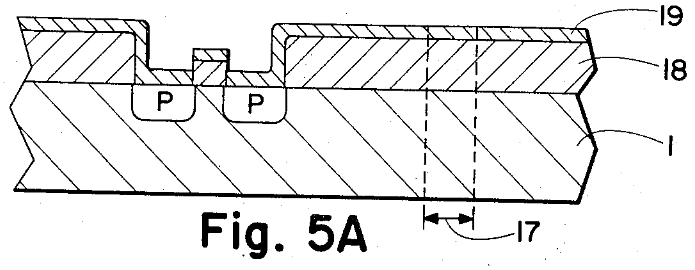
FIGS. 5A to 5H are sectional and plan views of a semiconductor chip showing stages of fabrication during an alternate method of manufacture.
Figure 5B:
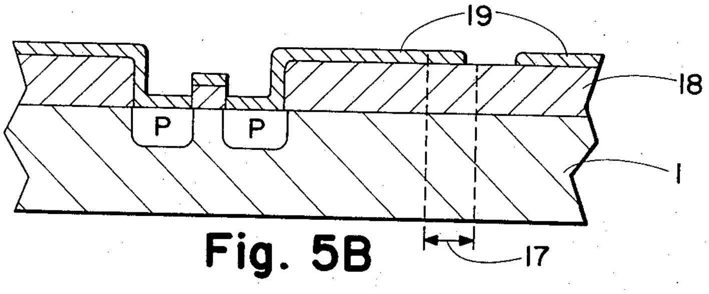
Figure 5C:
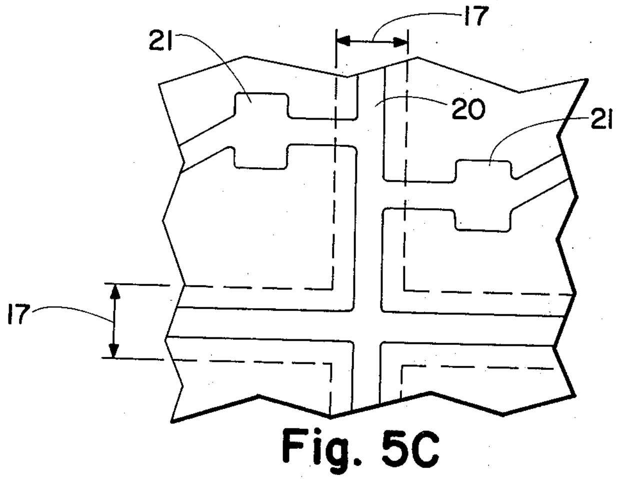
Figure 5D:
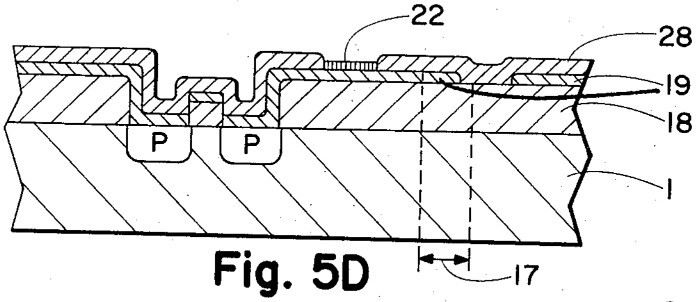

The aluminum interconnection pattern was then etched using a standard photolithographic process, but the metallization mask was modified to include a continuous metal grid 20 lying within the separation channels 17, electrically connected and continuous with each of the terminal site areas 21, as shown in plan in FIG. 5C. FIG. 5B shows a sectional view of the wafer with the aluminum layer 19 etched as noted above.

The wafer was then completely passivated with a coating of phosphorous doped silicon dioxide 28, produced by the low temperature pyrolytic oxidation of silane.

The terminal site areas 21 referred to above could have been the same size and placement as those normally used for wire bonding, and portions thereof used to delineate the adherent regions for the beam leads of this invention. Holes were then etched in the silicon dioxide layer 28 using the well-known photolithographic process normally used to provide access to the bonding pads for wire bonding purposes, except that the mask used was modified to produce holes over those parts of the terminal site areas corresponding to the required adherent regions of the beam leads.

The entire slice was then dipped into an alkaline zincate solution which dissolves the aluminum oxide on the surface of the aluminum, and immersion-deposits a thin layer of zinc (not shown) on the exposed aluminum in the beam areas. It was found that the resulting zinc-adherent skin was about 1,000 angstroms in thickness, but this may vary since the reaction is self-limiting. The zinc was then electrolessly coated with nickel 22 (FIG. 5D), using the nickel plating solution described in the previous example. The nickel is usefully built up to a thickness of approximately between 0.5 and 2 microns, and typically is about 1 micron.

The zinc and nickel metallurgy is described in U.S. Pat. No. 3,597,658 to John Rivera, issued Aug. 3, 1971.

It was found that the zinc and nickel layers deposit only over the exposed aluminum, and not over the oxide 28, nor over the metal grid 20 which is covered with oxide 28.

Up until now, the process described in copending U.S. Pat. application Ser. No. 229,993 filed Feb. 28, 1972, by C. A. Hamer and A. Loro entitled Fabrication of Beam Leads has been followed.

Figure 5E:
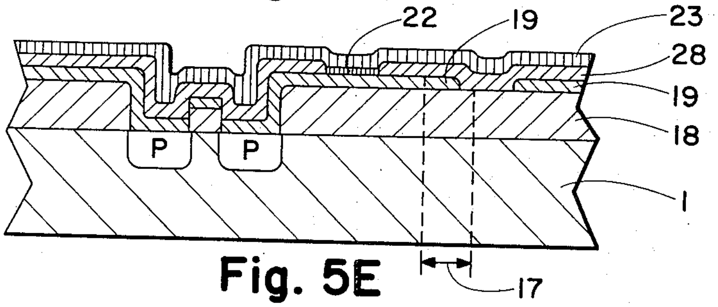

The wafer was next passed through a solution of stannous chloride as described in the first example, rinsed briefly, then passed through an acid solution of palladium chloride as also described in the first example. It was then rinsed again and immersed in the hot electroless nickel plating bath previously described. This process resulted in a continuous deposit of nickel 23 over the entire top surface of the wafer, including over the exposed nickel 22 and silicon dioxide 28 surfaces (FIG. 5E). It should be pointed out that the second nickel coating 23 adheres well to the first nickel deposit 22, but very poorly to the silicon dioxide layer 28.

Another photolithographic mask was applied to the top surface of the wafer in such manner that only the anchor pad areas, plus the additional areas of the beams themselves were left uncoated with photoresist, while the remainder of the surface was covered. Electrical connection was made to the wafer, which was then immersed in a gold electroplating bath, whereupon about 15 microns of gold was deposited on the exposed nickel beam areas.

Figure 5F:
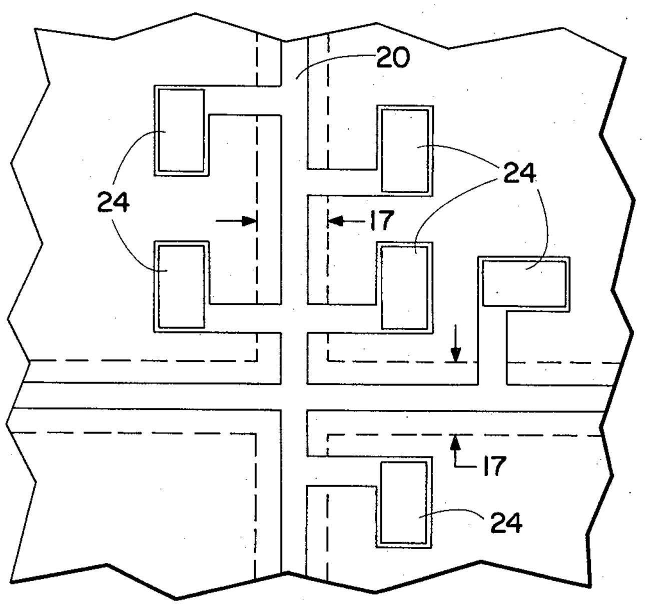

FIG. 5F shows a portion of the surface of the wafer in plan, at the junction of four chips. The beam areas 24 are coated with gold, and the aluminum grid 20 is shown within separation channels 17, interconnecting each of the beam areas. The aluminum metallization paths connecting the beam areas 24 to the active integrated circuit regions have been deleted from the figure. The entire surface of the wafer, with the exception of the gold coated beam areas 24 is passivated with the oxide layer 28.

Figure 5G:
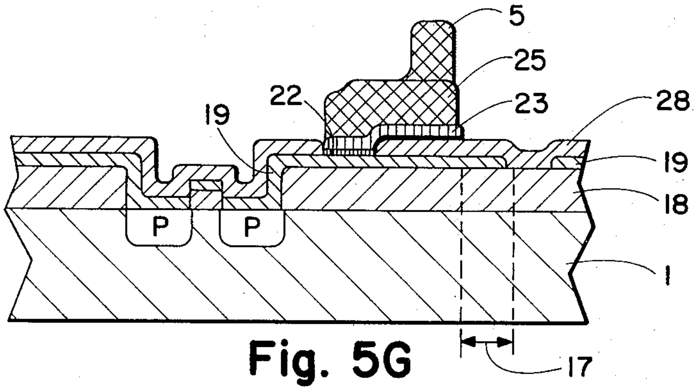

Turning now to FIG. 5G, a section of the surface is shown in which the first nickel deposit 22 is adherently coated with the second nickel coating 23, which further extends under the beam over silicon dioxide layer 28 in a poorly or non-adherent manner. The non-adherent interface between the second nickel coating 23 and the silicon dioxide layer 28 is shown as a thickened dark line.

The thick gold beams 25 were then thickened locally to produce raised lands 5, by applying another photolithographic mask to the wafer, which left exposed the land areas to be further plated on the surface of the gold beams 25 opposite the region at which the nickel layer 23 is adherent to the nickel deposit 22. The mask also left exposed that portion of the oxide layer 28 overlying the aluminum grid 20, as well as the connections from the grid to the edge of the separation channel 17. The wafer was then immersed in the gold plating bath, and the exposed raised land bonding areas plated with about an additional 15 microns of gold. During this operation, no plating occurred on the aluminum grid or other aluminum metallized areas, since the entire remainder of the surface was still protected by a layer of silicon dioxide.

Figure 5H:
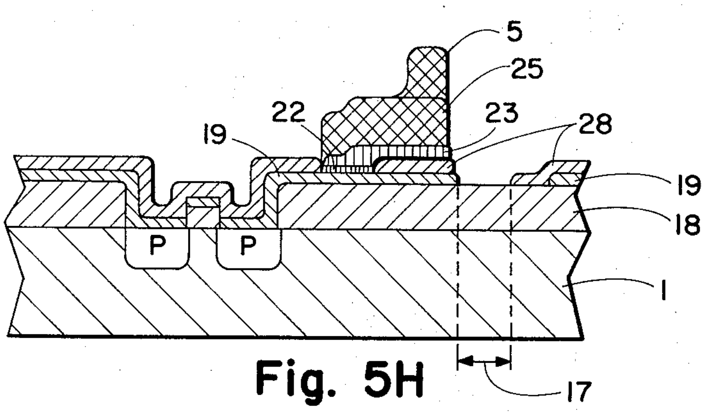

The entire wafer, with the photoresist mask still applied, was then immersed in a well-known buffered hydrofluoric acid solution for a sufficient time to remove the exposed silicon dioxide layer from over the aluminum grid over the separation channels 17, and the connections therefrom to the edge of the separation channel. The wafer was then rinsed in water and transferred to a bath of phosphoric acid etchant solution for sufficient time to remove the exposed aluminum grid and connections therefrom to the beams, as shown in FIG. 5H. The photoresist mask was then removed and the wafer thoroughly washed in deionized water, and dried. It was then subjected to a 1 hour bake at 300°C in air in order to optimize the adhesion between the gold and nickel in the beam areas.

After probing in a standard manner, the wafers were scribed and broken in the separation channel and handled similarly to chips which are to be wire bonded.

An adhesive tape tension test on the beams showed excellent adhesion of the beams at the anchor areas and upward bending of the remainder of the beams, the result of poor or non-adhesion of the beams to remaining areas thereof.

In both the examples described above, the beam dimensions each were about 100 × 110 microns, which is comparable with the area conventionally used for aluminum bonding pads. The anchor regions each measured about 100 × 50 microns, and the raised land areas about 100 × 24 microns, displaced from the anchor region laterally by about 36 microns.

While the preferred embodiment described above utilize tab shaped beams, other types of beam configuration may also be used. For instance, the beam may be circular in shape, with either the centre or a ring at the outside periphery respectively adherent to the chip, or carrying the raised land. Other configurations, such as a U-shape, rectangular, spiral, etc., may be used according to the specific requirements within the scope of this invention, and the term "arm" used herein is extended to embrace all such useful shapes.

As an alternative to the metal nickel in the first structural example, silver could have been used.

The chips fabricated according to this invention can be bonded to both thick or thin gold film on a substrate by placing the chips face down on the substrate, heating the substrate to a temperature of about 300°C and pressing down on the back of the chip with a flat faced anvil, and with a total force corresponding to, for example, between 50 and 100 grams for each bond required. The gold of the raised land will bond in a thermocompression or weld mode to the gold on the substrate. Accordingly, a single thrust of the ram will bond all beams to the substrate.

Complete bonding of large beam leaded chips can also be achieved using this technique, since motion between the chip and substrate can be used to bring mounting tabs into contact with the substrate which might otherwise have been out of contact due to slight lack of parallelism or flatness between the substrate or chip or slight variation in the height of the raised lands. All forces applied to the back face of the chip are applied to a flat lapped surface of silicon via a flat lap bonding tool. Therefore only a minute amount of elastic deformation of the land is required in order to bring the surfaces into intimate contact and to distribute the load uniformly.

On the front surface, all forces are applied to the silicon through the intermediacy of relatively soft electrodeposited gold, which is free to deform plastically and therefore limits the applied bonding force to a level comparable with that normally experienced in gold thermocompression bonding. Hence the bonding tool force applied to the locally elastically deformed substrate is sufficient to guarantee that all bonds formed allow full stress recovery between the chip and substrate as soon as the bonding force is released, due to the flexibility and malleability of the beams.

An alternative bonding technique was successfully demonstrated using a conventional wobble bonder designed for beam lead bonding. In this bonder the substrate is supported on a platform located at the equitorial plane of a metal hemisphere supported in a matching sliding hemispherical bearing. The radial axis normal to the plane surface of the hemispherical platform is made to rotate about a solid angle of approximately one half to one degree, while bonding forces are applied to the chip over the centre of the equitorial plane, through a rigid horizontally faced ram. This causes the maximum bonding force to move progressively around the periphery of the wafer, thereby insuring that all bonds are made, while exploiting the flexibility and stress relieving characteristics of bonds already formed to permit slight motion between the chip and substrate without destructively straining the bonds.

It is believed that the application of ultrasonic energy to the ram during bonding is also effective if low temperature bonding is desired, or if an all-aluminum metallic system is to be bonded.

It should be understood that it is not essential that the raised land be applied to the beam lead. Alternatively, for instance the equivalent of raised lands or gold bumps may be formed on the substrate to which the beams are bonded. Other variations will also become evident to one skilled in the art understanding this invention. Indeed, other metallurgical systems can be used within the scope of this invention, while using the principles thereof.

It has been found during destrictive deceleration tests of chips utilizing the inventive beams that failures occurred either by fracture of the chips themselves, or by tearing of the beams in the pliant arm portions, rather than at the thermocompression bonds or at the anchor regions, which illustrates the high reliability of the beam leads.

It is to be understood that the above described arrangements are illustrative of the application of the principles of the invention. Numerous other arrangements may be devised by those skilled in the art without departing from the spirit and scope of the invention.

What is claimed is:

1. A terminal for a semiconductor device comprising a terminal anchor region on the surface of a semiconductor chip, a conductive beam terminal adherent to the anchor region, the beam terminal having a pliant arm portion non-adherent to the surface extending over another portion of the chip, its boundary extending no further than the boundary of the chip, and a connection pad region on the surface of said arm a predetermined distance from the anchor region.

2. A terminal as defined in claim 1 further comprising a raised land extending upwardly from said connection pad region.

3. A terminal as defined in claim 2, in which the arm portion is comprised of a tab extending in one direction from the anchor region, the raised land being disposed at the opposite end thereof.

4. A terminal as defined in claim 2, in which the arm portion is comprised of a plate adherent at a position centrally thereof to the anchor region, the raised land bordering within its periphery.

5. A terminal as defined in claim 3 in which the tab and the land are both comprised of gold.

6. A terminal as defined in claim 5, further including successive layers of a metal chosen from the group consisting of nickel and silver; platinum, and titanium between the beam terminal and the anchor region, and successive layers of said metal and titanium underlying the arm portion of the beam lead.

7. A terminal as defined in claim 5, further including successive layers of nickel and aluminum underlying the anchor region of the beam terminal and successive layers of nickel, silicon dioxide and aluminum underlying the arm portion of the beam lead.

8. A terminal as defined in claim 3, further including a metallized conduction path of the semiconductor device extending along the surface, located between the tab and the nearest edge of the chip.

9. Means for mounting a semiconductor device to a substrate comprising a semiconductor chip, a beam terminal adherent at a selected position to the semiconductor device and generally non-adherent at all other positions, the beam terminal extending no further than the edge of the chip, and having a connection pad region on the surface of the beam terminal a distance from said selected position, a substrate having a terminal pad in mirror juxtaposed position to the connection pad region, and means for bonding the connection pad region to the terminal pad.

10. A mounting means as defined in claim 9 in which said means for bonding is comprised of a gold promontory malleably sandwiched between the connection pad region and the terminal pad.

* * * * *